United States Patent
Sweet et al.

(10) Patent No.: US 6,828,067 B2
(45) Date of Patent: Dec. 7, 2004

(54) ABLATABLE DIRECT WRITE IMAGING MEDIUM

(75) Inventors: Norman Sweet, Waterford, MI (US); Scott Zavada, Wixom, MI (US)

(73) Assignee: Precision Coatings, Inc., Walled Lake, MI (US)

( * ) Notice: Subject to any disclaimer, the term of this patent is extended or adjusted under 35 U.S.C. 154(b) by 302 days.

(21) Appl. No.: 10/120,669

(22) Filed: Apr. 11, 2002

(65) Prior Publication Data

US 2002/0164495 A1 Nov. 7, 2002

Related U.S. Application Data

(60) Provisional application No. 60/283,737, filed on Apr. 13, 2001.

(51) Int. Cl.$^7$ ................................................. G03F 9/00
(52) U.S. Cl. ...................... 430/5; 430/270.1; 428/534; 428/216
(58) Field of Search .................. 430/5, 270.1; 428/534, 428/216

(56) References Cited

U.S. PATENT DOCUMENTS 6,485,839 B1 * 11/2002 Nagarkar et al. ........... 428/461

* cited by examiner

Primary Examiner—Geraldine Letscher
(74) Attorney, Agent, or Firm—Gifford, Krass, Groh, Sprinkle, Anderson & Citkowski, P.C.

(57) ABSTRACT

An ablatable, direct write imaging medium includes a polymeric matrix having a carbon pigment and an ultraviolet absorbing dye therein. The carbon pigment functions to absorb relatively long wavelengths of light to cause ablation of the medium. The ultraviolet absorbing dye gives the ablation-imaged medium high optical density in ultraviolet portions of the spectrum.

20 Claims, 2 Drawing Sheets

ABLATABLE DIRECT WRITE IMAGING MEDIUM

RELATED APPLICATION

This application claims priority of U.S. Provisional Patent Application No. 60/283,737 filed Apr. 13, 2001 entitled "Ablatable Direct Write Imaging Medium" which is incorporated herein by reference.

FIELD OF THE INVENTION

This invention relates generally to photo responsive materials and methods for their use. More specifically, the invention relates to a direct write imaging medium which is capable of having an image formed directly thereupon by a beam of light, without the use of any photo mask or negative.

BACKGROUND OF THE INVENTION

Photolithographic and/or photo etch techniques are widely used in the fabrication of printed circuit boards, semiconductor devices, the preparation of printing plates, graphic arts, and a number of other such processes. Such photo techniques generally employ one or more masks, also referred to as photo tools. The photo tool is used as a master in the exposure of other photosensitive materials. In general, materials used for photo tools should have very high resolution and should be capable of presenting a high contrast, stable image at imaging wavelengths. That is to say, the photo tool material should have an image area which is highly absorbing of imaging wavelengths, and a background area which is highly transparent at imaging wavelengths. In addition, such photo tool material should exhibit relatively high resolution. Furthermore, such material should be easy to use, and should most preferably employ a dry imaging process which is free from toxic compounds.

In response to the foregoing needs, the art has investigated a number of ablation imaging systems. In such ablation systems, a high intensity flux of light energy is applied to an imaging material which contains a species which absorbs that energy. The absorption of light promotes localized heating which causes portions of the imaging material to be removed from a base substrate thereby creating an image-wise pattern corresponding to the illumination. In some instances, layers of metal are employed as in the manufacture of such films. Metals are highly efficient at absorbing incident illumination; however, many metals require fairly high levels of illumination to cause their ablation. In addition, metals have a very broad band of optical absorption; and in some instances, this is advantageous since the resultant films have a very high optical density throughout the visible and ultraviolet spectrum. However, in graphic arts, electronics and other specialized applications, ultimate use of photo masks and tools thus generated takes place at ultraviolet and near ultraviolet wavelengths, and the industry favors photo masks having reasonably good transparency at visible wavelengths, since this allows for ease of mask alignment.

In other instances, carbon, typically in the form of a fine dispersion of carbon black particles, is employed as light absorbing material in photo ablatable films. While carbon has very good light absorption characteristics in the infrared and near infrared portions of the spectrum, dispersions of carbon particles are relatively poor at absorbing shorter wavelengths of light, particularly light in the blue and infrared portion of the spectrum. As a result, compositions which employ carbon as an absorbing medium need to be very heavily loaded if the resultant products are to have reasonably good light absorption in the ultraviolet and near ultraviolet portions of the spectrum. Such heavily loaded films are very opaque at visible wavelengths; furthermore, it has been found that the presence of relatively large amounts of carbon actually decrease the sensitivity of such film since relatively large amounts of energy are required to ablate away the heavy carbon loadings.

In view of the foregoing, the inventors hereof have recognized that there is a need for an ablatable film which is relatively sensitive at infrared and near infrared wavelengths and which produces a photo generated image which has very high optical density at near ultraviolet and ultraviolet wavelengths. Furthermore, such film should most preferably be relatively transparent at visible wavelengths. As will be explained in greater detail hereinbelow, the present invention provides a photo ablatable film which may be used as a discrete photo tool, or in combination with other imaging layers. The material of the present invention has very high absorption at ultraviolet wavelengths, but can be fabricated to be relatively transparent at visible wavelengths. Furthermore, the material is low in cost and easy to use. These and other advantages of the invention will be apparent from the drawings, discussion and description which follow.

BRIEF DESCRIPTION OF THE INVENTION

There is disclosed herein a light ablatable, ultraviolet absorbing imaging medium. The imaging medium includes a substrate member, which is most preferably a transparent substrate. A body of light ablatable, ultraviolet absorbing material is supported upon the substrate. The body includes a polymeric matrix having a carbon pigment dispersed in at least a portion of the thickness of the matrix. The matrix further includes an ultraviolet absorbing dye dissolved in at least a portion of the thickness of the matrix. Most preferably, the concentration of carbon in the body is selected to be such that the optical absorption of the body at a wavelength of 360 nm attributable to the carbon is less than 50% of the optical absorption of the body at 360 nm which is attributable to the remainder of the components thereof.

In some embodiments, the body of light ablatable material is configured as a single layer of said polymeric matrix wherein the carbon is dispersed therein and the dye is dissolved therein. In other instances, the body comprises a plurality of superposed layers including a first layer, which is closest to the substrate and which includes the carbon pigment therein but which does not include the dye. In this embodiment, a second layer, which is separated from the substrate by the first layer, has the dye dissolved therein. In one specific version of this embodiment, the first layer is devoid of any urethane polymer.

In specific embodiments, the dye comprises an azo dye having high absorption for ultraviolet and near ultraviolet wavelengths, and low absorption for visible wavelengths.

In a specific class of embodiments of this invention, a layer of photo responsive material, such as a photo polymerizable material or a photo degradable material, is disposed between the substrate and the body of light ablatable, ultraviolet absorbing material. In this embodiment, patterning of the light ablatable, ultraviolet absorbing material provides an integral photo mask atop the layer of photo responsive material, and this mask can be used in connection with the further photo imaging of the photo responsive material. Also disclosed herein are methods for using the materials of the present invention.

DETAILED DESCRIPTION OF THE INVENTION

Figure 1:
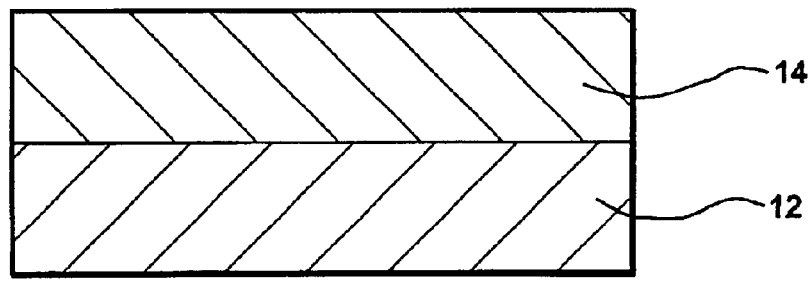
FIG. 1 is a cross-sectional view of one embodiment of imaging medium structured in accord with the principles of the present invention.

The present invention comprises an imaging medium which can be written upon by a high intensity beam of light such as a laser beam. The medium of the present invention has very high resolution and provides a high contrast, stable image. The imaging medium of the present invention is dimensionally stable, durable, archival and low in cost.

The material of the present invention is an ablatable medium; that is to say, high intensity radiation, such as that provided by a laser, causes the disruption and/or physical removal of portions of the imaging medium. In this manner, a scanned or otherwise modulated laser beam can be employed to directly write onto an imaging film of the present invention so as to produce a photo mask or other such photo tool. The process of the present invention can be readily implemented utilizing a computer controlled light source, and is adaptable to very high speed, high precision imaging processes.

In accord with the present invention, photo masks and other such photo tools are fabricated by an ablation process wherein the absorption of light employed in the ablation process for patterning the mask is separated from the absorption of light which occurs in the use of the mask. As will be explained in detail, this separation of functions is counterintuitive, but when implemented confers significant advantages in the fabrication and use of the photo masks of the present invention. Fabrication of the masks is most advantageously carried out utilizing a laser ablation process which operates at visible to infrared wavelengths. Low cost, high power, simple to control lasers operating in the infrared, near infrared and visible portions of the spectrum are readily available for this purpose.

Carbon black is a particularly preferred material for absorbing such long wavelength illumination and converting it to heat for driving an ablation imaging process. In this regard, carbon is very low in cost, nontoxic, and highly effective in absorbing the ablation producing wavelengths of light. However, carbon black is not a preferred material for absorbing ultraviolet radiation, as is required of a patterned photo tool. The extinction coefficient of carbon black is not particularly high for ultraviolet wavelengths; consequently, if it is the primary absorber of ultraviolet wavelengths, relatively large amounts must be employed. The presence of large amounts of carbon black causes the imaging material to be relatively opaque at visible wavelengths, which complicates the use of any patterned photo tool. Even more significantly, the presence of relatively large amounts of carbon black has been found to decrease the efficiency of the ablation process, since relatively large amounts of input energy will then be required to remove the highly absorbing, carbon-containing layer. This finding is somewhat counterintuitive, since layers which are very lightly loaded with carbon are very poor absorbers of visible and ultraviolet radiation, and hence fairly insensitive.

The surprising finding of the present invention is that maximum sensitivity of the ablation process is achieved when relatively light loadings of carbon are employed, and these loadings are generally insufficient to provide the resultant, patterned photo tool with a practical optical density at the ultraviolet, and near ultraviolet, wavelengths at which it will be used. Therefore, in accord with the present invention, it has been found that optimum performance of the material and process of the present invention is achieved when the active layer or layers include relatively small amounts of carbon black used to drive the ablation process which is carried out at relatively long wavelengths of light, and when said layers further include an ultraviolet absorbing dye, which preferably has little or no absorption at the ablation process wavelengths, but which has high absorptions at the near ultraviolet and ultraviolet wavelengths encountered in the use of the resultant photo tool.

While carbon black is a preferred material for the practice of the present invention, because of cost, availability and efficiency, equivalent materials may be substituted therefor. For example, very fine dispersions of metals such as silver, tellurium, platinum and iron may be formed by chemical or photochemical processes, and such dispersions may be used in place of carbon in the present invention. Likewise, organic or inorganic pigment particles may be substituted for the carbon. All of such embodiments are within the scope of this invention.

Two versions of the ablatable imaging material of the present invention as used for the preparation of a photo tool are illustrated with reference to FIGS. 1 and 2. FIG. 1 depicts one embodiment of imaging medium comprised of a support substrate 12 having the proprietary, ablatable coating of the present invention 14 deposited thereatop. The substrate 12 may comprise a transparent body of polymeric material such as a polyester or the like, or it may comprise glass, quartz or any other such transparent material known in the art. In certain applications, the substrate 12 may be opaque and/or reflective. The support substrate 12 should be dimensionally stable and compatible with the materials and process of the present invention. Many such materials will be readily available and apparent to one of skill in the art.

Disposed atop the substrate 12 is an ablatable coating 14. In accord with the present invention, the ablatable coating 14 includes carbon black and an ultraviolet absorbing dye, both of which are disposed in a polymeric matrix, which most preferably is a cross-linked polymeric matrix. The carbon black functions as a long wavelength light absorbing pigment and serves to capture light from the laser or other imaging light source. The captured light is converted to heat which drives the ablation process. Carbon black is particularly preferred for this purpose since it is highly absorbing of a broad range of wavelengths, low in cost, and readily available in very fine dispersions. The ultraviolet absorbing dye serves to provide the layer 14 with a high optical density at ultraviolet wavelengths in the ranges typically employed in photo tool applications. These wavelengths generally are in the near ultraviolet. A number of ultraviolet absorbing dyes may be employed in the practice of the present invention. One particularly preferred dye comprises an azo dye of the type disclosed in U.S. Pat. No. 5,747,197, the disclosure of which is incorporated herein by reference. This class of dyes is particularly advantageous in the present invention since its members have very high absorptions in the near ultraviolet region of the spectrum and are very stable to photo bleaching or photo degradation. These dyes are also advantageous for photo masking applications since they are relatively nonabsorbing at visible wavelengths.

The polymer matrix for the carbon black and dye is most preferably cross linked so as to resist attack by solvents and mechanical abrasion. One particularly preferred matrix is comprised of a mixture of nitrocellulose, cellulose acetate propionate and polyurethane.

The amounts of carbon pigment and dye are selected so that the optical absorption of the body of imaging material 14, at a wavelength of 360 nm which is attributable to the carbon, is less than 25% of the light absorption of that body at 360 nm which is attributable to the remainder of the components (primarily the dye) thereof. By so balancing the light absorptions, the respective roles of the carbon and dye in the ablation and ultimate photo mask functions are effectively separated. The fact that the carbon is not needed to give light absorption at short wavelengths increases the sensitivity of the medium in the ablation process, while the relatively high dye loading makes the imaged medium a very effective photo mask for subsequent applications. In specific embodiments, the loadings of carbon and dye are selected so that less than 25% of the 360 nm absorption is attributable to carbon; while in other specific embodiments, the absorption due to carbon at 360 nm is only 10% of that of the remainder of the components in the medium.

Figure 2:
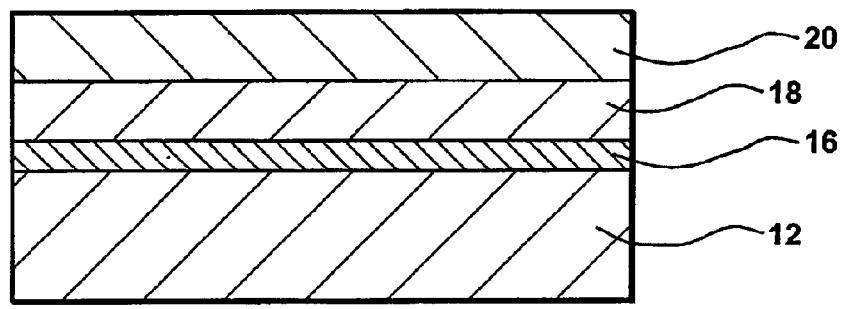
FIG. 2 is a cross-sectional view of another embodiment of imaging medium structured in accord with the principles of the present invention wherein the body of light ablatable, ultraviolet absorbing material is a multi-layered body.

Referring now to FIG. 2, there is shown another embodiment of imaging medium structured in accord with the principles of the present invention. The FIG. 2 embodiment includes a substrate 12 which is generally similar to the substrate discussed with reference to FIG. 1. As illustrated in FIG. 2, the imaging material includes a first subcoating 16 disposed atop the substrate material 12. The subcoating 16 serves to enhance the adhesion of superjacent layers to the substrate material 12. As is known in the art, polyester materials are frequently coated with a subcoating comprised of an acrylic material, and one particularly preferred acrylic subcoating comprises a material sold by the Mitsubishi Chemical Company under the designation number 4507. Frequently, polyester stock material is provided by manufacturers with subcoating layers in place, as a stock material. It is to be understood that in a number of embodiments, the subcoating layer may be dispensed with.

The FIG. 2 embodiment further includes two imaging layers 18, 20 structured in accord with the principles of the present invention. In this embodiment, the first layer 18 is comprised of a carbon black pigment disposed in a cross-linked matrix, which may comprise a matrix material which in a specific embodiment includes nitrocellulose and cellulose acetate together with a cross-linking agent. In this embodiment, the first layer 18 does not include any ultraviolet absorbing dye, nor does it include any urethane material. A second layer 20 is disposed atop the first layer. This layer 20 is generally similar to layer 14 of FIG. 1 and includes carbon black, an ultraviolet absorbing dye, nitrocellulose, cellulose acetate propionate and urethane together with cross-linking agents.

It is notable that in the structure of FIG. 2, the ultraviolet absorbing dye is confined to the second layer 20, and the first layer 18 does not include any urethane polymer. The reason for this structure is that the inventors hereof have found that, in some instances, the ultraviolet absorbing dye can move through a relatively thin imaging layer and stain an underlying substrate member so that when the imaging layer is ablated, some ultraviolet absorbing dye remains on the substrate, thereby adding unwanted optical density to the imaged area of the film. Such migration appears to be enhanced by the presence of the urethane. Therefore, in the FIG. 2 structure, the first layer 16, which is free of ultraviolet absorbing dye and urethane, provides an effective barrier. Depending upon the nature of the substrate and the ultraviolet absorbing dye, such a barrier structure may or may not be required. In view of this disclosure, yet other structures will be readily apparent to one of skill in the art.

In the operation of the film of the present invention, high intensity laser light, typically having a wavelength in the near ultraviolet to infrared, and most preferably in the infrared, is scanned, in an imagewise manner, across the surface of the film. This causes selective ablation of the film so as to produce a photo tool in which the imaged areas have a very low optical density in the near ultraviolet region, and the background areas have very high optical density in the near ultraviolet.

In accord with the teaching presented herein, numerous formulations will be readily apparent to one of skill in the art. (In this application, all percentages are stated on the basis of weight.) An ablatable imaging medium generally similar to that shown in FIG. 2 was prepared as follows. A first pass coating solution was prepared in a solvent mixture comprising 47.3 kg methyl ethyl ketone, 6.5 kg methyl isobutyl ketone and 15.5 kg cyclohexanone. 23.3 kg of carbon pigment comprising a carbon black paste sold by Penn Color under the designation 68B49 was stirred into the solvent mixture. This carbon black paste is comprised of 16% nitrocellulose (RS type 0.5 second), 24% carbon black paste and 60% of a proprietary solvent blend of esters and alcohols. Cellulose acetate propionate (CAP 482-20 Eastman Kodak, 20 seconds) in an amount of 3.1 kg was dissolved in the solvent together with 3.5 kg of hexamethoxymethylmelamine resin (Cymel 303 sold by the Cytec Corporation). To this was added 0.8 kg of a curing agent comprised of 25% amine blocked para-toluene sulphonic acid in a solvent blend of isopropanol and methanol (Nacure 2530 King Industries). This mixture was stirred to produce a homogenous solution having a viscosity of 30–35 seconds with a #2 Zahn cup. This mixture comprised approximately 16.2% solids.

This first pass solution was extrusion coated onto a polyester substrate having a relatively thin (less than 0.5 mil) sub-coating of the aforementioned 4507 acrylic material. This coating was allowed to dry, and then cross linked by heating to a temperature of approximately 310° F. for 1½ to 2 minutes.

A second pass coating solution was prepared utilizing a solvent system comprised of 46.8 kg of methyl ethyl ketone, 2.7 kg of methyl isobutyl ketone and 4.0 kg of cyclohexanone. 19.3 kg of the aforedescribed carbon black paste was dissolved in the solvent mixture together with 2.4 kg of the cellulose acetate propionate (CAP 482-20) polymer, 8.2 kg of the Cymel 303 resin and 0.6 kg of the Nacure 2530 curing agent. In addition, 8.0 kg of a urethane polymer (82% urethane diol in propylene glycol mono-methylether acetate, K-Flex UD-320 obtained from King Industries). Also included in this composition was 8.0 kg of a 60% solution of azo dye in acetone. This particular dye is available from Precision Coatings Inc. under the designation T-114, and it is an azo dye of the type disclosed in the patent incorporated by reference hereinabove. This second composition included solids in the approximate range of 26–31%, and it had a viscosity of 35–40 seconds with a #2 Zahn cup. This composition was coated to a thickness of approximately 0.5–1 mils atop the cured first layer. Following evaporation of solvent, this layer was cured by heating at 310° F. for 1½ to 2 minutes, and resulted in the production of a film structure generally similar to that of FIG. 2.

In those instances where a single layer composition, such as that of FIG. 1 is being prepared, the second pass solution may be coated directly onto a substrate. In those instances where a single layer film is being prepared, such coatings are applied to produce a finished, cured thickness in the range of approximately 0.1–0.2 mils.

The present invention has been described hereinabove, with reference to FIGS. 1 and 2, in connection with the manufacture of a photo mask supported on a transparent substrate 12. As is known in the art, in many instances, photo masks and the like are directly formed onto a workpiece which itself can be considered the substrate. Such in situ masks are employed in the manufacture of printing plates, semiconductors and the like, as is mentioned hereinabove. In this regard, the present invention will further be described with reference to the manufacture of a printing plate, as illustrated in FIGS. 3A–3D.

Figure 3A:
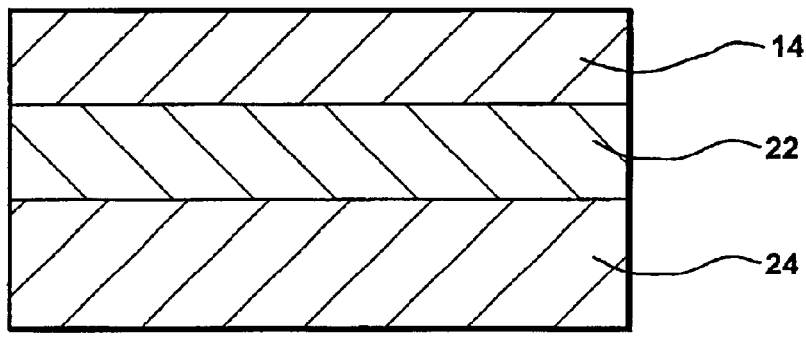
FIG. 3A is a cross-sectional view of another embodiment of imaging medium which includes two separate photo responsive layers.

Referring now to FIG. 3A, there is shown a cross-sectional view of an ablatable imaging material of the present invention. The material of FIG. 3A includes an ablatable coating 14, which is generally similar to the coatings described hereinabove with reference to FIG. 1. Likewise, it is to be understood that the coating 14 may also be configured as a multi-layered coating comprised of layers 18 and 20, as discussed with reference to FIG. 2 hereinabove. The coating 14 is disposed upon a body of photo responsive material 22 which functions as a support substrate for the ablatable layer 14. The photo responsive material 22 may be any one of such materials well known in the art. Such materials undergo a photochemical reaction, typically at ultraviolet wavelengths, which alter their solubility properties with regard to particular solvent mixtures. As a consequence of exposure, such photopolymeric materials either become soluble in, or resist dissolution by, a developing solvent. Thus, if these materials are selectively masked, and then exposed to activating radiation and developed, they can yield a relief image which may be employed as a printing plate, or as a resist layer for subsequent etching or deposition steps. As illustrated in FIG. 3A, the layer of photo responsive material 22 is a layer of a photopolymer and is further supported on a substrate member 24. The substrate 24 may comprise a cured portion of the layer of photopolymeric material 22, and such curing may be carried out either before, during or after the actual imaging process. Likewise, the substrate member 24 may comprise a different polymeric material, a sheet of glass, metal or the like; or, depending upon the particular application, may be dispensed with.

Figure 3B:
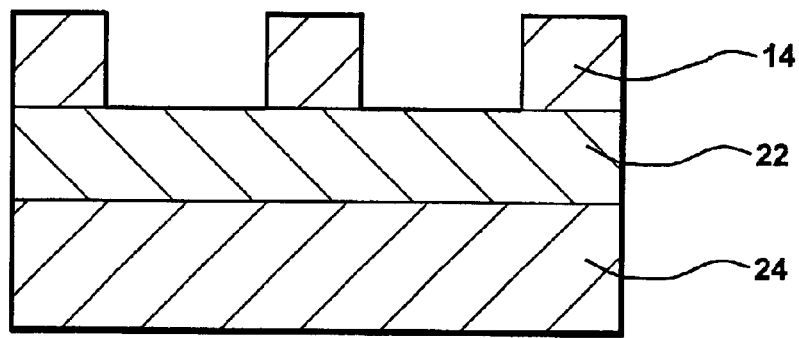
FIGS. 3B–3D show sequential steps in the use of the imaging medium of FIG. 3A.

Referring now to FIG. 3B, there is shown a first step in the use of the FIG. 3A material. As illustrated therein, imaging radiation, typically at near infrared or infrared wavelengths, and typically at relatively high flux density, is directed onto the ablatable layer 14 in an imagewise pattern. The carbon material in the ablatable layer 14 absorbs this long wavelength radiation, converting it to heat, and causing an imagewise ejection of the light struck portions of the layer 14. The underlying body of photopolymeric material 22 is relatively non-absorbing of this imaging radiation and is hence unaffected by it.

Figure 3C:
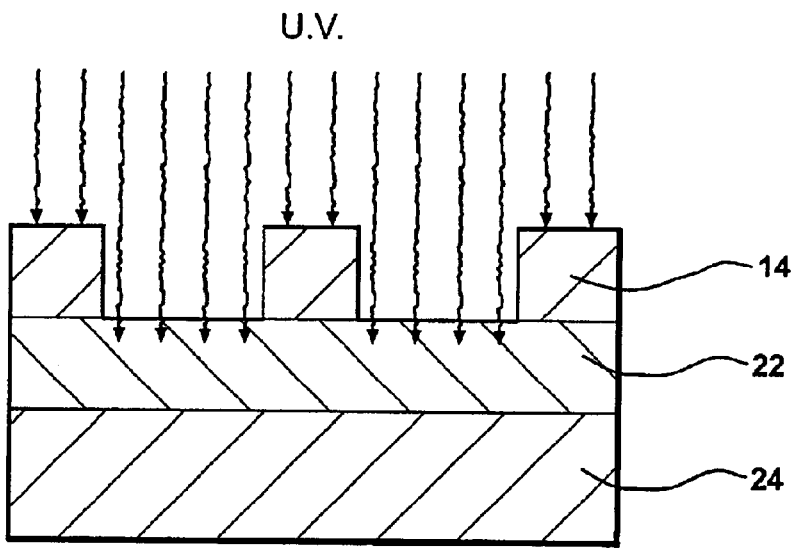
Figure 3D:
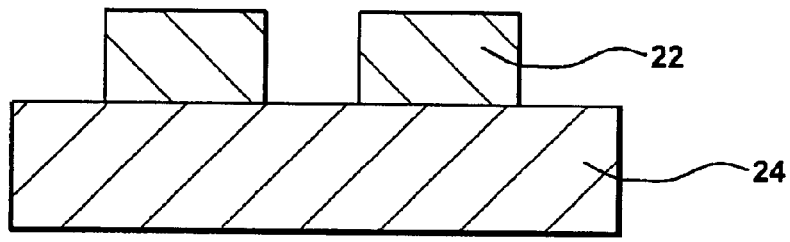

As a result of the imagewise ablation of the layer 14, a masking pattern is directly formed on the body of photopolymeric material 22. This in situo mask is highly absorbing of ultraviolet radiation because of the presence of the ultraviolet absorbing dye therein. In a subsequent step of the invention, as shown in FIG. 3C, the patterned material is subjected to flood illumination with ultraviolet light, and this ultraviolet illumination penetrates the unmasked portions of the photopolymeric material 22 creating, in this particular embodiment, cross links which render the photopolymeric material 22 resistant to solvent attack in the irradiated areas. As shown in FIG. 3D, the ultraviolet exposed body of material is subjected to a developing solvent which removes the remainder of the ablatable layer 14 as well as subjacent portions of the photopolymer 22, with the result being that an imagewise pattern of material 22 is formed on the substrate 24. This pattern may be then employed as a printing plate, a resist pattern or the like.

The matrix materials for the ablatable layers in this embodiment of the present invention will be generally similar to those which may be employed in the FIGS. 1 and 2 embodiments. However, depending on the particular developer solvent used for processing the photopolymeric layer, the matrix polymer used for the ablatable layer may be uncross linked or only slightly cross linked. In this embodiment, as in the foregoing embodiments shown in FIGS. 1 and 2, the choice of particular materials, concentrations and reagents will depend upon specific applications and will be readily apparent to one of skill in the art in view of the teachings presented herein.

In view of the disclosure herein, yet other embodiments of the present invention will be readily apparent to one of skill in the art.

What is claimed is:

1. A light ablatable, ultraviolet absorbing imaging medium, said medium comprising:
    a substrate member; and
    a body of light ablatable, ultraviolet absorbing material supported by the substrate, said body comprising:
        a polymeric matrix;
        a carbon pigment dispersed in at least a portion of the thickness of the matrix; and
        an ultraviolet absorbing dye dissolved in at least a portion of the thickness of the matrix; wherein the concentration of carbon in said body is such that the optical absorption of said body at a wavelength of 360 nm attributable to said carbon is less than 50% of the optical absorption at 360 nm of said body which is attributable to the remainder of the components thereof.

2. The imaging medium of claim 1, wherein the concentration of carbon in said body is such that the optical absorption of said body at 360 nm attributable to said carbon is less than 25% of the absorption of said body at 360 nm which is attributable to the remainder of the components thereof.

3. The imaging medium of claim 1, wherein the concentration of carbon in said body is such that the optical absorption of said body at 360 nm attributable to said carbon is less than 10% of the absorption of said body at 360 nm which is attributable to the components thereof.

4. The imaging medium of claim 1, wherein said body comprises a single layer having said carbon dispersed therein, and wherein said dye dissolved therein.

5. The imaging medium of claim 1, wherein said body comprises a plurality of superposed layers including a first layer, which is closest to said substrate, which first layer includes said carbon pigment therein, but does not include said dye; and a second layer, which is separated from the substrate by said first layer, said second layer including said dye therein.

6. The imaging medium of claim 5, wherein said first layer does not include any urethane polymer therein.

7. The imaging medium of claim 5, wherein said first layer has a thickness in the range of 0.05–0.1 mil, and said second layer has a thickness in the range of 0.1–0.2 mil.

8. The imaging medium of claim 1, wherein said polymeric matrix is at least partially cross-linked.

9. The imaging medium of claim 1, wherein said carbon comprises carbon black.

10. The imaging medium of claim 1, wherein said matrix comprises a polymeric material selected from the group consisting of cellulose acetate propionate, cellulose acetate butyrate, nitrocellulose, urethane and combinations thereof.

11. The imaging medium of claim 1, wherein said polymeric matrix includes cellulose acetate propionate therein.

12. The imaging medium of claim 1, wherein said ultraviolet absorbing dye comprises an azo dye.

13. The imaging medium of claim 1, wherein the white light optical density of said unablated medium is no more than 0.5.

14. The imaging medium of claim 1, wherein the optical density at 360 nm of said unablated medium is at least 2.0.

15. The imaging medium of claim 1, further including a layer of photo responsive material interposed between said substrate and said body of light ablatable, ultraviolet absorbing material; whereby when, said body can be selectively ablated so as to perform a photo mask on said layer of photo responsive material.

16. The imaging medium of claim 15, wherein said layer of photo responsive material comprises a layer of photo polymerizable material.

17. The imaging medium of claim 15, wherein said layer of photo responsive material comprises a layer of photodegradable material.

18. A method of forming a photo mask, said method comprising the steps of:
   providing a light ablatable, ultraviolet absorbing imaging medium, said medium comprising a substrate, and a body of light ablatable, ultraviolet absorbing material supported by said substrate, said body comprising:
      a polymeric matrix, an infrared absorbing pigment disposed in at least a portion of the thickness of said polymeric matrix, and an ultraviolet absorbing dye dissolved in at least a portion of the thickness of said polymeric matrix, wherein the concentration of said pigment is such that the optical absorption of said body at a wavelength of 360 nm which is attributable to said pigment is less than 50% of the absorption of said body which is attributable to the remainder of the components of said body; and
   exposing said medium to an imagewise pattern of illumination having an energy level and profile sufficient to ablate said body from said substrate whereby an imagewise pattern is formed in said imaging medium.

19. The method of claim 18, wherein said step of exposing said imaging medium comprises exposing said medium to light having a wavelength of at least 750 nm.

20. A method for forming an imagewise pattern on a layer of photo responsive material, said method comprising the steps of:
   disposing a body of light ablatable, ultraviolet absorbing imaging medium in a superposed relationship with said layer of photo responsive material, said imaging medium comprising a polymeric matrix having a particulate material dispersed in at least a portion of the thickness of the matrix, and an ultraviolet absorbing dye dissolved in at least a portion of the thickness of the matrix, wherein the concentration of said particulate material in said matrix is such that the optical absorption of said imaging medium at 360 nm, which is attributable to said particulate material, is less than 50% of the absorption of said medium at 360 nm which is attributable to the remainder of the components thereof;
   exposing said imaging medium to an imagewise pattern of light having an energy sufficient to cause ablation of said imaging medium whereby the imaging medium is ablated to form an imagewise pattern; and
   illuminating said layer of photo responsive material through said imagewise pattern, with light which is capable of activating said photo responsive material.

* * * * *